(12) United States Patent
Ichikawa

(10) Patent No.: US 12,418,095 B2
(45) Date of Patent: Sep. 16, 2025

(54) ELECTRONIC DEVICE INCLUDING BENT PORTION

(71) Applicant: Murata Manufacturing Co., Ltd., Nagaokakyo (JP)

(72) Inventor: Keiichi Ichikawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 293 days.

(21) Appl. No.: 18/128,263

(22) Filed: Mar. 30, 2023

(65) Prior Publication Data

US 2023/0247765 A1 Aug. 3, 2023

Related U.S. Application Data

(63) Continuation of application No. PCT/JP2021/036967, filed on Oct. 6, 2021.

(30) Foreign Application Priority Data

Oct. 19, 2020 (JP) ................... 2020-175085

(51) Int. Cl.
*H01Q 1/22* (2006.01)
*H01Q 9/04* (2006.01)
(Continued)

(52) U.S. Cl.
CPC ......... *H01Q 1/2283* (2013.01); *H01Q 9/0407* (2013.01); *H05K 1/144* (2013.01);
(Continued)

(58) Field of Classification Search
CPC ............. H05K 1/144; H05K 2201/042; H05K 2201/10098; H01Q 9/0407; H01Q 1/2283; H01L 24/16

See application file for complete search history.

(56) References Cited

U.S. PATENT DOCUMENTS 10,957,973 B2 * 3/2021 Ariumi ................. H01Q 3/24
11,791,535 B2 * 10/2023 Makurin .............. H05K 1/0242
343/850

(Continued)

FOREIGN PATENT DOCUMENTS

JP 2006253953 A 9/2006
JP 2008028106 A 2/2008
(Continued)

OTHER PUBLICATIONS

International Search Report in PCT/JP2021/036967, mailed Jan. 11, 2022, 3 pages.
(Continued)

*Primary Examiner* — James Wu
(74) *Attorney, Agent, or Firm* — Keating & Bennett, LLP

(57) ABSTRACT

A first board body includes a first board body upper main surface and a first board body lower main surface that are arranged in a vertical direction. A second board body includes a second board body upper main surface and a second board body lower main surface that are arranged in the vertical direction. The second board body is above the first board body such that the first board body upper main surface and the second board body lower main surface face each other. A semiconductor element is mounted on the first board body lower main surface. An antenna is provided on the second board body. A thickness of a metal plate is larger than a thickness of a first conductor pattern. The metal plate is surface-joined to the first board body upper main surface to overlap the semiconductor element.

19 Claims, 10 Drawing Sheets

(51) Int. Cl.
*H05K 1/14* (2006.01)
*H01L 23/00* (2006.01)

(52) U.S. Cl.
CPC ........ *H01L 24/16* (2013.01); *H05K 2201/042* (2013.01); *H05K 2201/10098* (2013.01)

(56) References Cited

U.S. PATENT DOCUMENTS

| | | |
|---|---|---|
| 11,831,089 B2 * | 11/2023 | Yi ........................ H01Q 9/0414 |
| 2006/0202312 A1 | 9/2006 | Iijima et al. |
| 2009/0173795 A1 | 7/2009 | Ochi et al. |
| 2010/0014267 A1 | 1/2010 | Kubota |

FOREIGN PATENT DOCUMENTS

| | | |
|---|---|---|
| JP | 2019009213 A | 1/2019 |
| JP | 2019029669 A | 2/2019 |
| WO | 2007105469 A1 | 9/2007 |

OTHER PUBLICATIONS

Written Opinion in PCT/JP2021/036967, mailed Jan. 1, 2022, 3 pages.

* cited by examiner

Fig.1
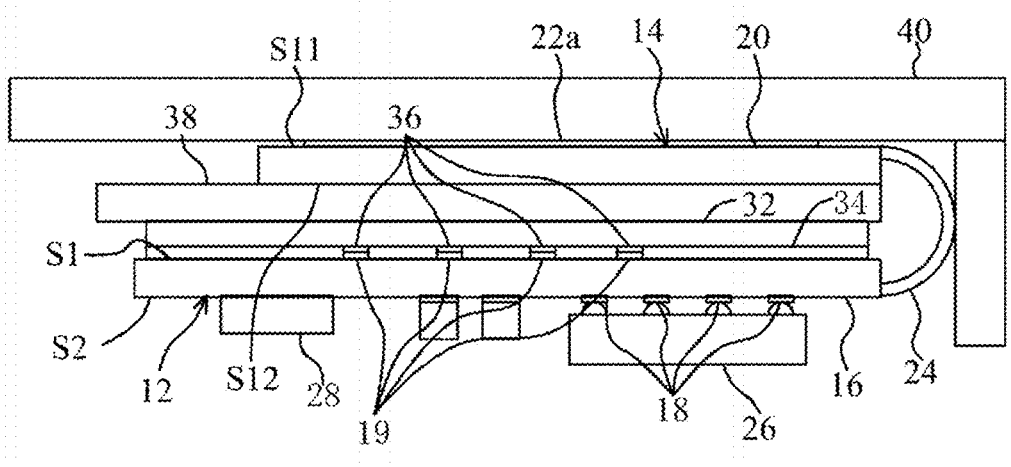
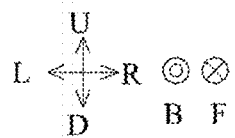

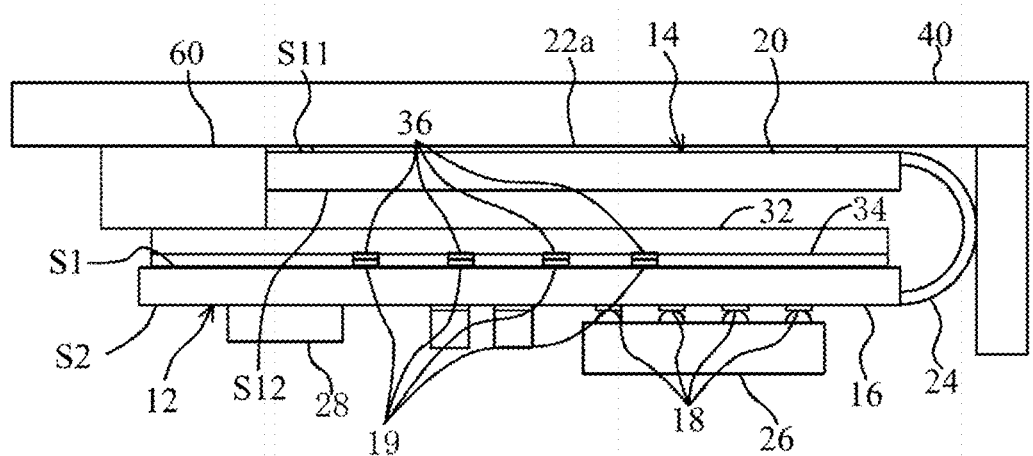
Fig.4
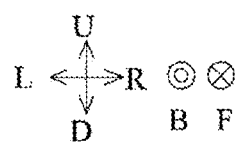

Fig.5
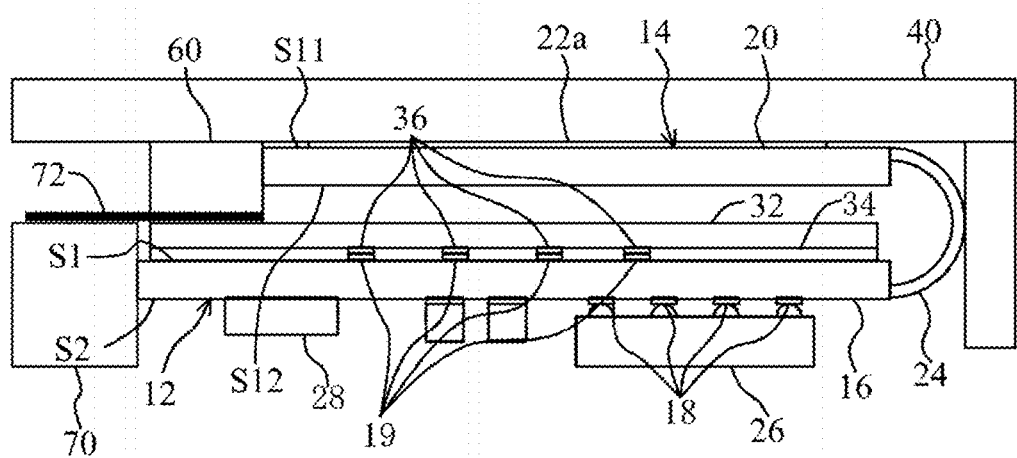
50:12,14,24
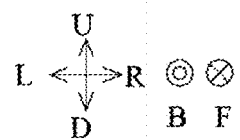

Fig.6
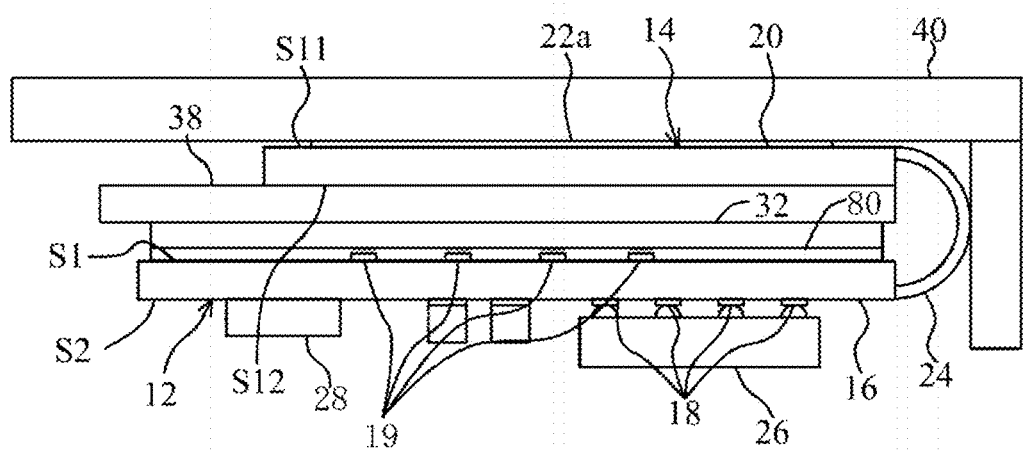
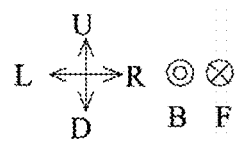

Fig.8
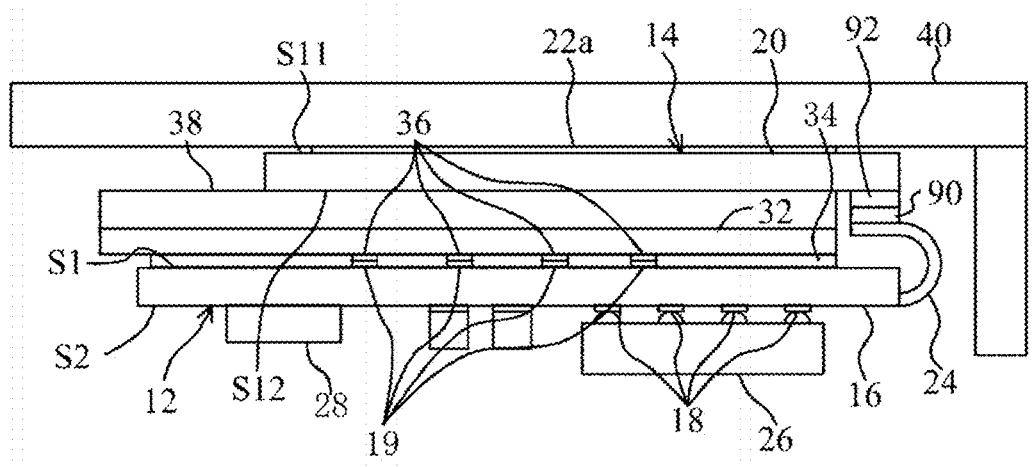
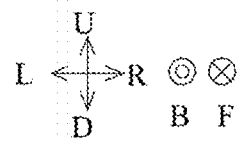

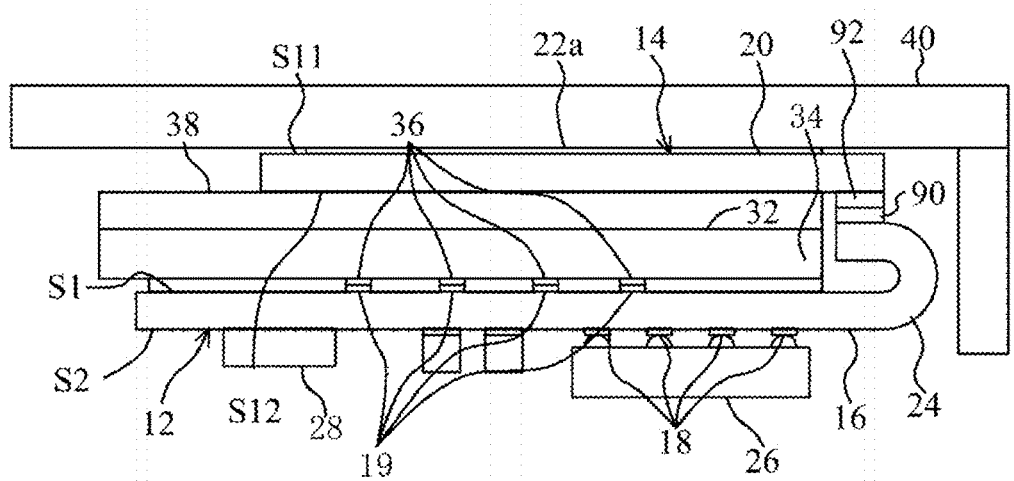
Fig.9
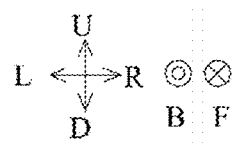

Fig.10
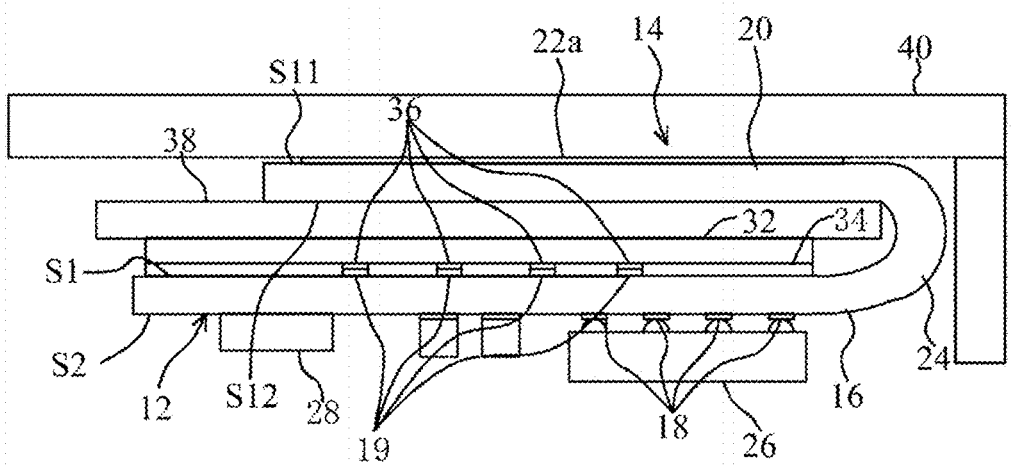
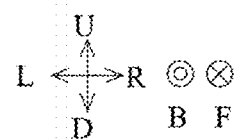

ELECTRONIC DEVICE INCLUDING BENT PORTION

CROSS REFERENCE TO RELATED APPLICATIONS

This application claims the benefit of priority to Japanese Patent Application No. 2020-175085 filed on Oct. 19, 2020 and is a Continuation Application of PCT Application No. PCT/JP2021/036967 filed on Oct. 6, 2021. The entire contents of each application are hereby incorporated herein by reference.

BACKGROUND OF THE INVENTION

1. Field of the Invention

The present invention relates to an electronic device including a semiconductor element and an antenna.

2. Description of the Related Art

For example, the laminated module described in JP-A-2019-29669 is a known conventional invention that relates to an electronic device. The laminated module includes an LCP laminated board, an LTCC laminated board, an antenna, and an IC chip. The LCP laminated board includes an upper portion, a lower portion, and a coupling portion. The upper portion of the LCP laminated board is provided above the lower portion of the LCP laminated board. The coupling portion of the LCP laminated board is connected to the upper portion of the LCP laminated board and the lower portion of the LCP laminated board. The coupling portion of the LCP laminated board is bent in the vertical direction. Accordingly, the LCP laminated board includes a U-shape turned 90 degrees clockwise.

The antenna is provided on the upper main surface of the upper portion of the LCP laminated board. The LTCC laminated board is provided on the upper main surface of the lower portion of the LCP laminated board. The IC chip is provided on the upper main surface of the LTCC laminated board. The LTCC laminated board is a rigid board. Accordingly, deformation of the lower portion of the LCP laminated board is suppressed by the LTCC laminated board. As a result, deviation of the disposition of the IC chip due to the deformation of the lower portion of the LCP laminated board is suppressed. That is, the reliability of mounting the IC chip onto the LCP laminated board is improved.

SUMMARY OF THE INVENTION

It should be noted that, in the laminated module described in JP-A-2019-29669, the distance between the IC chip and the antenna is small. Accordingly, the IC chip may be affected by an RF signal (electromagnetic wave) from the antenna. In addition, noise generated in the IC chip may be emitted through the antenna. Specifically, noise is emitted from the IC to the antenna. The antenna emits this noise.

Accordingly, preferred embodiments of the present invention provide electronic devices that each improve the reliability of mounting a semiconductor element onto a first board and prevent the semiconductor element from being affected by an RF signal from the antenna or prevent noise generated in the semiconductor element from being emitted through the antenna.

An electronic device according to a preferred embodiment of the present invention includes a first board including a first board body and a first conductor pattern; a second board including a second board body, a semiconductor element, an antenna, and a metal plate, in which the first board body includes a first board body upper main surface and a first board body lower main surface that are arranged in a vertical direction, the second board body includes a second board body upper main surface and a second board body lower main surface that are arranged in the vertical direction, the second board body is above the first board body such that the first board body upper main surface and the second board body lower main surface face each other, the semiconductor element is mounted on the first board body lower main surface, the antenna is provided on the second board body, and a thickness of the metal plate is larger than a thickness of the first conductor pattern, and the metal plate is surface-joined to the first board body upper main surface to overlap the semiconductor element in the vertical direction.

In an electronic device according to a preferred embodiment of the present invention, it is possible to improve the reliability of mounting the semiconductor element onto the first board and prevent the semiconductor element from being affected by the RF signal (electromagnetic wave) from the antenna or prevent noise generated in the semiconductor element from being emitted through the antenna.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a rear view of an electronic device 10.
FIG. 4 is a rear view of an electronic device 10a.
FIG. 5 is a rear view of an electronic device 10b.
FIG. 6 is a rear view of an electronic device 10c.
FIG. 8 is a rear view of an electronic device 10e.
FIG. 9 is a rear view of an electronic device 10f.
FIG. 10 is a rear view of an electronic device 10g.

DETAILED DESCRIPTION OF THE PREFERRED EMBODIMENTS

Preferred Embodiments

Structure of Electronic Device

Figure 2:
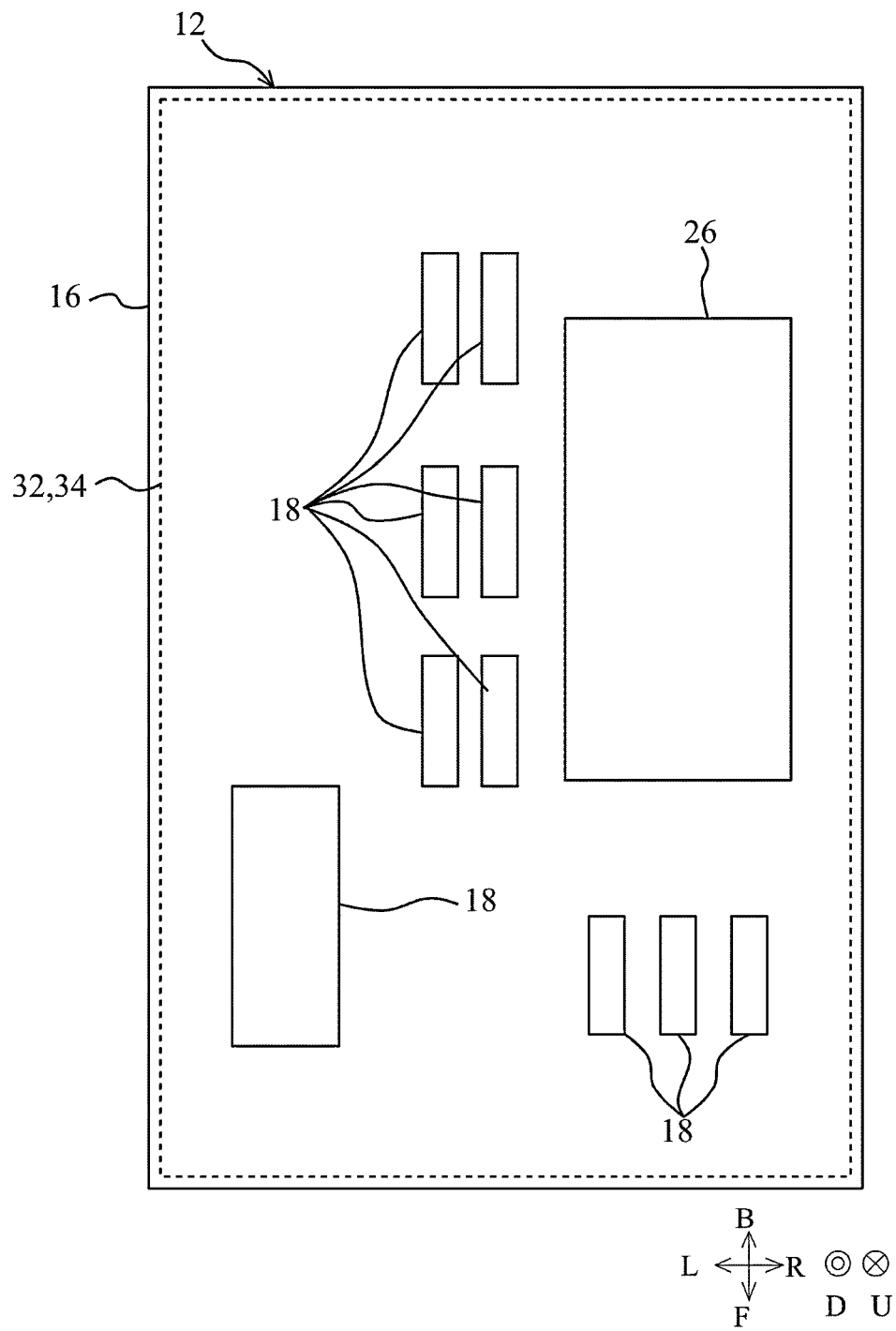
FIG. 2 is a bottom view of a first board 12.
Figure 3:
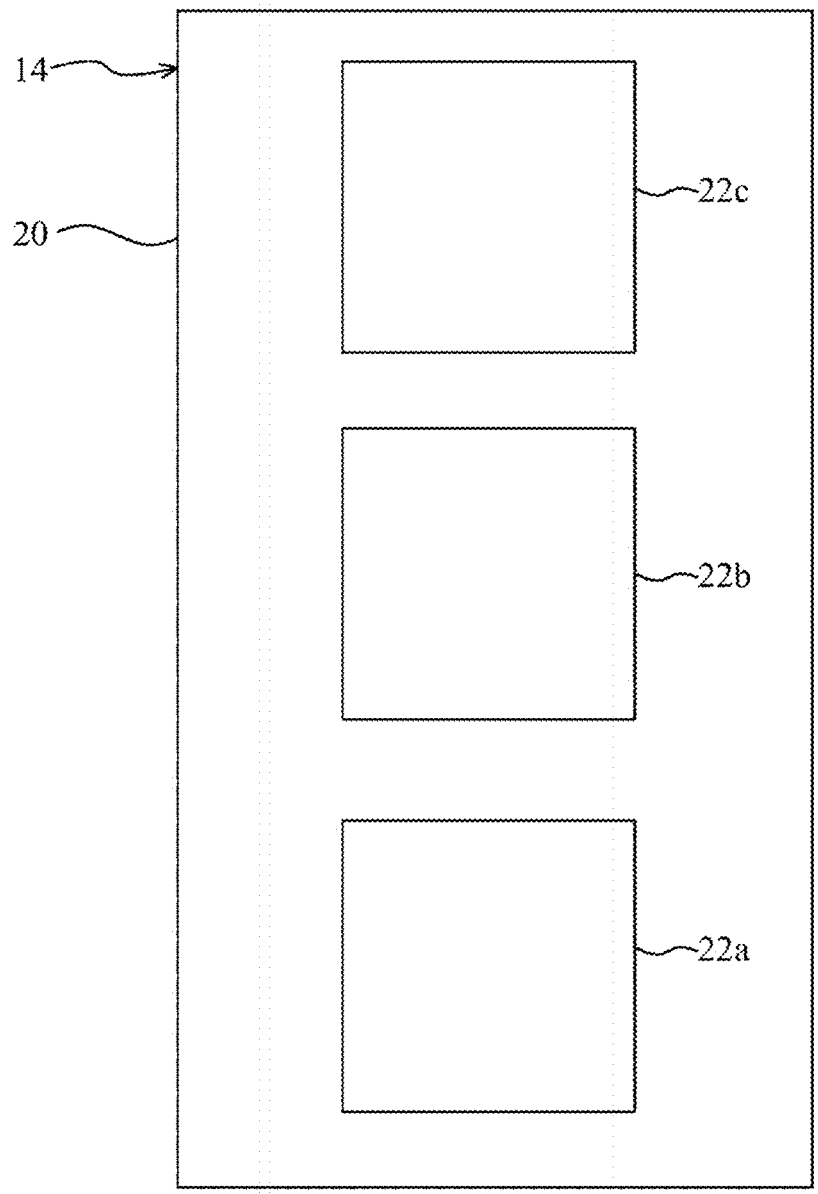
FIG. 3 is a top view of a second board 14.

The structure of an electronic device 10 according to a preferred embodiment of the present invention will be described below with reference to the drawings. FIG. 1 is a rear view of the electronic device 10. FIG. 2 is a bottom view of a first board 12. FIG. 3 is a top view of a second board 14.

In this specification, directions are defined as described below. A direction normal to a first board body upper main surface S1 is defined as the vertical direction. In addition, two directions orthogonal to the vertical direction are defined as the left-right direction and the longitudinal direction. The left-right direction is orthogonal to the longitudinal direction.

In the following description, X represents a component or a member of the electronic device 10. Unless otherwise specified, portions of X are defined as described below in this specification. The front portion of X represents the front half of X. The rear portion of X represents the rear half of X. The left portion of X represents the left half of X. The right portion of X represents the right half of X. The upper portion of X represents the upper half of X. The lower portion of X represents the lower half of X. The front end of X represents the end in the forward direction of X. The rear end of X represents the end in the backward direction of X. The left end of X represents the end in the left direction of X. The right end of X represents the end in the right direction of X. The upper end of X represents the end in the upward direction of X. The lower end of X represents the end in the downward direction of X. The front-end portion of X represents the front end of X and the vicinity thereof. The rear-end portion of X represents the rear end of X and the vicinity thereof. The left end portion of X represents the left end of X and the vicinity thereof. The right end portion of X represents the right end of X and the vicinity thereof. The upper end portion of X represents the upper end of X and the vicinity thereof. The lower end portion of X represents the lower end of X and the vicinity thereof.

First, the structure of the electronic device 10 will be described with reference to FIGS. 1 and 3. The electronic device 10 is, for example, a mobile communication terminal such as a smartphone. The electronic device 10 includes a first board 12, a second board 14, antennas 22a to 22c, a coupling portion 24, a semiconductor element 26, a plurality of electronic components 28, a metal plate 32, an insulating resin layer 34, a plurality of connection conductors 36, a spacer 38, and a housing 40.

The first board 12, the second board 14, and the coupling portion 24 are included in one resin board 50. The resin board 50 includes one or more insulator layers across the first board 12, the second board 14, and the coupling portion 24. The first board 12 is a resin multi-layer board. Specifically, as illustrated in FIG. 1, the first board 12 includes a first board body 16 and a plurality of first conductor patterns 18 and 19. The first board body 16 includes a structure in which a plurality of insulator layers are laminated together in the vertical direction. The material of the plurality of insulator layers is, for example, a thermoplastic resin, such as a liquid crystal polymer or a polyimide. As illustrated in FIG. 2, the first board body 16 has a rectangular or substantially rectangular shape as viewed in the vertical direction, for example. The long sides of the first board body 16 extend in the longitudinal direction. The short sides of the first board body 16 extend in the left-right direction. The first board body 16 includes a first board body upper main surface S1 and a first board body lower main surface S2 arranged in the vertical direction. The first board body upper main surface S1 is located above the first board body lower main surface S2. In this specification, "the first board body upper main surface S1 is located above the first board body lower main surface S2" indicates the following state. At least a portion of the first board body upper main surface S1 is disposed within a region through which the first board body lower main surface S2 passes when the first board body lower main surface S2 moves upward in parallel. Accordingly, the first board body upper main surface S1 may fall in the region through which the first board body lower main surface S2 passes when the first board body lower main surface S2 moves upward in parallel, or the first board body upper main surface S1 may project from the region through which the first board body lower main surface S2 passes when the first board body lower main surface S2 moves upward in parallel. In the present preferred embodiment, the first board body upper main surface S1 fall in the region through which the first board body lower main surface S2 passes when the first board body lower main surface S2 moves upward in parallel.

The plurality of first conductor patterns 18 are provided on the first board body lower main surface S2. Each of the plurality of first conductor patterns 18 preferably has a rectangular or substantially rectangular shape as viewed in the vertical direction. The plurality of first conductor patterns 18 are mounting electrodes for mounting a semiconductor element 26, which will be described later.

The plurality of first conductor patterns 19 are provided on the first board body upper main surface S1. Each of the plurality of first conductor patterns 19 preferably has a rectangular or substantially rectangular shape as viewed in the vertical direction. The plurality of first conductor patterns 19 are electrically connected to the metal plate 32, which will be described later. The plurality of first conductor patterns 18 and 19 are formed by, for example, patterning a copper foil by a photolithography process or the like.

The second board 14 is a resin multi-layer board. Specifically, the second board 14 includes a second board body 20 as illustrated in FIG. 1. The second board body 20 includes a structure in which a plurality of insulator layers are laminated together in the vertical direction. The material of the plurality of insulator layers is, for example, a thermoplastic resin, such as a liquid crystal polymer or a polyimide. As illustrated in FIG. 3, the second board body 20 preferably has a rectangular or substantially rectangular shape as viewed in the vertical direction. The long sides of the second board body 20 extend in the longitudinal direction. The short sides of the second board body 20 extend in the left-right direction. The thickness of the second board 14 is smaller than the thickness of the first board 12. The second board body 20 includes a second board body upper main surface S11 and a second board body lower main surface S12 that are arranged in the vertical direction. The second board body upper main surface S11 is located above the second board body lower main surface S12. The second board body 20 is disposed above the first board body 16 such that the first board body upper main surface S1 and the second board body lower main surface S12 face each other. In this specification, "the first board body upper main surface S1 and the second board body lower main surface S12 face each other" indicates, for example, the following two conditions. The first condition is that the angle defined by the normal vector of the first board body upper main surface S1 and the normal vector of the second board body lower main surface S12 is about 180°, for example. However, the directions of these two normal vectors may deviate from about 180° within a range of about ±45°, for example. The second condition is that the second board body 20 overlaps the first board body 16 in the direction (that is, in the vertical direction) of the normal vector of the first board body upper main surface S1.

As illustrated in FIG. 1, the coupling portion 24 is bent in the vertical direction to couple the first board body 16 and the second board body 20 to each other. The coupling portion 24 is curved to project in the right direction as viewed in the longitudinal direction. The coupling portion 24 is more likely than the first board body 16 and the second board body 20 to bend in the vertical direction. Accordingly, the thickness of the coupling portion 24 is smaller than the thickness of the first board body 16 and the thickness of the second board body 20.

The semiconductor element 26 is an RFIC (radio frequency integrated circuit). Accordingly, the semiconductor element 26 generates a transmission signal obtained by modulating a carrier wave having a predetermined frequency by transmission data and outputs the transmission signal to the antennas 22a to 22c. The semiconductor element 26 obtains reception data by demodulating the reception signal received by the antennas 22a to 22c. The semiconductor element 26 is mounted on the first board body lower main surface S2. More specifically, as illustrated in FIG. 1, the semiconductor element 26 is mounted on the first conductor patterns 18 via solder bumps.

As illustrated in FIG. 1, the plurality of electronic components 28 are mounted on the first board body lower main surface S2 of the first board body 16. The plurality of electronic components 28 are, for example, electronic chip components and semiconductor elements.

The antennas 22a to 22c emit, as an electromagnetic wave, the transmission signal output by the semiconductor element 26. The antennas 22a to 22c output the received electromagnetic wave to the semiconductor element 26 as the reception signal. Accordingly, the antennas 22a to 22c are electrically connected to the semiconductor element 26. The antennas 22a to 22c are patch antennas. As illustrated in FIG. 1, the antennas 22a to 22c are provided on the second board body 20. In the present preferred embodiment, the antennas 22a to 22c include the second conductor patterns provided on the second board body upper main surface S11. As illustrated in FIG. 3, each of the antennas 22a to 22c preferably has a square or substantially square shape as viewed in the vertical direction. As illustrated in FIG. 3, the antennas 22a to 22c are arranged in a line from back to front in this order. The antennas 22b and 22c overlap the semiconductor element 26 in the vertical direction. The antennas 22a to 22c are formed by, for example, patterning a copper foil by a photolithography process or the like.

As illustrated in FIG. 2, the metal plate 32 is a plate-shaped member having a rectangular or substantially rectangular shape as viewed in the vertical direction. A Young's modulus of the material of the metal plate 32 is higher than a Young's modulus of the material of the first board body 16. The material of the metal plate 32 is, for example, SUS (steel use stainless), a copper alloy (spring material), or the like. As illustrated in FIG. 1, the thickness of the metal plate 32 is larger than the thickness of the first conductor patterns 18 and 19. Accordingly, the metal plate 32 is less likely than the first board 12 to deform. The metal plate 32 is surface-joined to the first board body upper main surface S1 so as to overlap the semiconductor element 26 in the vertical direction. Specifically, the insulating resin layer 34 is an adhesive layer through which the metal plate 32 is surface-joined to the first board body upper main surface S1. In the surface-joint, the region in which the metal plate 32 and the first board body upper main surface S1 are joined to each other is planar as viewed in the vertical direction. In the surface-joint, the length in the longitudinal direction of the insulating resin layer 34 and the length in the left-right direction of the insulating resin layer 34 are larger than the thickness in the vertical direction of the insulating resin layer 34. The insulating resin layer 34 is, for example, an underfill including a thermosetting acrylic or epoxy resin. Accordingly, the insulating resin layer 34 is provided between the metal plate 32 and the first board body upper main surface S1. In addition, the metal plate 32 overlaps substantially the entire first board body upper main surface S1 in the vertical direction. Accordingly, the metal plate 32 overlaps the entire semiconductor element 26 in the vertical direction. In addition, the metal plate 32 overlaps the antennas 22a to 22c in the vertical direction. Accordingly, the metal plate 32 is disposed between the antennas 22a to 22c and the semiconductor element 26.

However, as illustrated in FIG. 1, the metal plate 32 is electrically connected to the plurality of first conductor patterns 19. More specifically, the plurality of connection conductors 36 are provided on the plurality of first conductor patterns 19, respectively. The plurality of connection conductors 36 are made of, for example, solder. The metal plate 32 is electrically connected to the plurality of first conductor patterns 19 via the plurality of connection conductors 36. Accordingly, the metal plate 32 is connected to the ground potential.

As illustrated in FIG. 1, the spacer 38 is provided between the second board body lower main surface S12 and the metal plate 32. As a result, the spacer 38 maintains a distance between the second board body lower main surface S12 and the metal plate 32. The spacer 38 is a plate-shaped member. The upper main surface of the spacer 38 is in contact with the second board body lower main surface S12. The lower main surface of the spacer 38 is in contact with the upper main surface of the metal plate 32. The spacer 38 may be a member that includes only a function (spacer function) of maintaining the distance between the second board body lower main surface S12 and the metal plate 32 or may be a member that includes an additional function other than the spacer function. The additional function is, for example, a display panel or a battery.

As illustrated in FIG. 1, the housing 40 accommodates the first board 12, the second board 14, the antennas 22a to 22c, the coupling portion 24, the semiconductor element 26, the plurality of electronic components 28, the metal plate 32, the insulating resin layer 34, the plurality of connection conductors 36, and the spacer 38. The housing 40 is the display panel, the case, or the like of the electronic device 10. When the housing 40 is the display panel, the housing 40 is a glass plate. When the housing 40 is the case, the housing 40 is a metal plate, a glass plate, or a resin plate.

Effect

In the electronic device 10, the reliability of mounting the semiconductor element 26 onto the first board 12 is improved. More specifically, when the first board body 16 deforms, stress is applied to the connection portion between the first board body 16 and the semiconductor element 26. Such stress causes the connection portion between the first board 12 and the semiconductor element 26 to break. That is, such stress causes the electrical disconnection between the first board 12 and the semiconductor element 26 to break. Accordingly, in the electronic device 10, the metal plate 32 is surface-joined to the first board body upper main surface S1. This causes the metal plate 32 to reinforce the first board body 16. Accordingly, the metal plate 32 reduces or prevents the deformation of the first board body 16. As a result, application of stress to the connecting portion between the first board body 16 and the semiconductor element 26 is reduced or prevented. Therefore, in the electronic device 10, the reliability of mounting the semiconductor element 26 onto the first board 12 is improved.

In the electronic device 10, it is possible to prevent the semiconductor element 26 from being affected by the RF signal (electromagnetic wave) from the antennas 22a to 22c or prevent noise generated in the semiconductor element 26 from being emitted through the antennas 22a to 22c. More specifically, the second board body 20 is disposed above the first board body 16 such that the first board body upper main surface S1 and the second board body lower main surface S12 face each other. The semiconductor element 26 is mounted on the first board body lower main surface S2. The antennas 22a to 22c are provided on the second board body 20. In addition, the metal plate 32 is surface-joined to the first board body upper main surface S1 so as to overlap the semiconductor element 26 in the vertical direction. Accordingly, the metal plate 32 is located between the antennas 22a to 22c and the semiconductor element 26. Therefore, the RF signal (electromagnetic wave) emitted through the antennas 22a to 22c is blocked by the metal plate 32 and less likely to reach the semiconductor element 26. Similarly, noise emitted by the semiconductor element 26 is blocked by the metal plate 32 and less likely to reach the antennas 22a to 22c. Accordingly, in the electronic device 10, it is possible to prevent the semiconductor element 26 from being affected by the RF signal (electromagnetic wave) from the antennas 22a to 22c or reduce or prevent noise generated in the semiconductor element 26 from being emitted through the antennas 22a to 22c. In particular, the metal plate 32 is connected to the ground potential. Accordingly, in the electronic device 10, it is possible to more effectively prevent the semiconductor element 26 from being affected by the RF signal (electromagnetic wave) from the antennas 22a to 22c or to more effectively reduce or prevent noise generated in the semiconductor element 26 from being emitted through the antennas 22a to 22c.

In the electronic device 10, the metal plate 32 overlaps the antennas 22a to 22c in the vertical direction. Accordingly, in the electronic device 10, it is possible to more effectively prevent the semiconductor element 26 from being affected by the RF signal (electromagnetic wave) from the antennas 22a to 22c or to more effectively reduce or prevent noise generated in the semiconductor element 26 from being emitted through the antennas 22a to 22c.

In the electronic device 10, variations in the impedance in consideration of the antennas 22a to 22c and variations in the emission characteristics of the antennas 22a to 22c are reduced or prevented. More specifically, the spacer 38 is provided between the second board body lower main surface S12 and the metal plate 32 to reduce or prevent changes in the distance between the second board body lower main surface S12 and the metal plate 32. This reduces or prevents fluctuations in the distance between the antennas 22a to 22c and the metal plate 32. Accordingly, fluctuations in the capacitance generated between the antennas 22a to 22c and the metal plate 32 are reduced or prevented. Accordingly, in the electronic device 10, variations in the impedance in consideration of the antennas 22a to 22c and variations in the emission characteristics of the antennas 22a to 22c are reduced or prevented.

In the electronic device 10, variations in the emission characteristics of the antennas 22a to 22c are reduced or prevented. More specifically, the coupling portion 24 is more likely than the first board body 16 and the second board body 20 to bend in the vertical direction. To achieve this, in the electronic device 10, the thickness of the coupling portion 24 is smaller than the thickness of the first board body 16 and the thickness of the second board body 20. Accordingly, the coupling portion 24 is more likely to deform. Furthermore, the stress applied by the coupling portion 24 to the first board body 16 and the second board body 20 when the coupling portion 24 deforms is reduced. Accordingly, the second board body 20 is prevented from being deformed by the stress applied by the coupling portion 24 to the second board body 20 when the coupling portion 24 deforms. The deformation of the second board body 20 reduces or prevents the distance between the antennas 22a to 22c and the metal plate 32 from changing. As a result, in the electronic device 10, variations in the emission characteristics of the antennas 22a to 22c are reduced or prevented. In addition, the breakage of the resin board 50 is reduced or prevented.

In the electronic device 10, the heat generated in the first board 12 and the semiconductor element 26 diffuses via the metal plate 32. This improves the cooling efficiency of the first board 12 and the semiconductor element 26.

First Modification

An electronic device 10a according to a first modification will be described below with reference to the drawings. FIG. 4 is a rear view of the electronic device 10a.

The electronic device 10a differs from the electronic device 10 in that the electronic device 10a includes a support member 60 instead of the spacer 38. More specifically, the housing 40 supports the second board 14. The support member 60 is supported by the housing 40. The support member 60 supports the first board 12. In addition, the support member 60 overlaps the first board 12 and does not overlap the second board 14 in the vertical direction. The other structure of the electronic device 10a is the same as that of the electronic device 10, and accordingly, description thereof is omitted.

In the electronic device 10a, variations in the emission characteristics of the antennas 22a to 22c are reduced or prevented and losses due to the spacer 38 are reduced or prevented. More specifically, the housing 40 supports the second board 14. The support member 60 is supported by the housing 40. The support member 60 supports the first board 12. Accordingly, the support member 60 reduces or prevents changes in the distance between the second board body lower main surface S12 and the metal plate 32. Accordingly, fluctuations in the distance between the antennas 22a to 22c and the metal plate 32 are reduced or prevented. Accordingly, fluctuations in the capacitance generated between the antennas 22a to 22c and the metal plate 32 are reduced or prevented. In the electronic device 10a, variations in the emission characteristics of the antennas 22a to 22c are reduced or prevented. Furthermore, the support member 60 overlaps the first board 12 and does not overlap the second board 14 in the vertical direction. Accordingly, the support member 60 is not present between the antennas 22a to 22c and the metal plate 32. That is, there is an air layer between the antennas 22a to 22c and the metal plate 32. An increase in the dielectric constant in the region between the antennas 22a to 22c and the metal plate 32 is reduced or prevented. As a result, in the electronic device 10a, losses due to the spacer 38 are reduced. At this time, the metal plate 32 can be used as the ground for the antennas 22a to 22c.

Second Modification

An electronic device 10b according to a second modification will be described below with reference to the drawings. FIG. 5 is a rear view of the electronic device 10b.

The electronic device 10b differs from the electronic device 10a in that the electronic device 10b further includes a frame 70 and a thermal conductor 72. The frame 70 is the internal skeleton of the electronic device 10b. Accordingly, the frame 70 supports components (not illustrated) provided within the housing 40. However, the frame 70 may support the resin board 50. The material of the frame 70 is, for example, a metal such as aluminum.

The thermal conductor 72 is a film through which the metal plate 32 and the frame 70 are connected to each other. The thermal conductor 72 is attached to the metal plate 32 and the frame 70 with an adhesive or the like. The material of the thermal conductor 72 includes high thermal conductivity. The material of the thermal conductor 72 is, for example, graphite, copper, or aluminum. Accordingly, the heat generated in the first board 12 and the semiconductor element 26 is transferred to the frame 70 via the metal plate 32 and the thermal conductor 72. This improves the cooling efficiency of the first board 12 and the semiconductor element 26 more effectively.

In addition, when the thermal conductor 72 is made of a conductive material, the frame 70 (metal component) is electrically connected to the metal plate 32. The frame 70 is connected to the ground potential. Accordingly, the potential of the metal plate 32 becomes more stable. It should be noted that the other structure of the electronic device 10b is the same as that of the electronic device 10a, and accordingly, description thereof is omitted.

Third Modification

An electronic device 10c according to a third modification will be described below with reference to the drawings. FIG. 6 is a rear view of the electronic device 10c.

The electronic device 10c differs from the electronic device 10 in that the electronic device 10c includes an anisotropic conductive film 80 instead of the insulating resin layer 34. More specifically, the anisotropic conductive film 80 is commonly referred to as an ACF (anisotropic conductive film). The anisotropic conductive film 80 is a conductive and insulating film-type joint material having a structure in which conductive particles are uniformly dispersed in a thermosetting resin. The anisotropic conductive film 80 as described above can connect a plurality of terminals and a plurality of terminals to each other at the same time. The anisotropic conductive film 80 surface-joins the metal plate 32 to the first board body upper main surface S1 and electrically connects the metal plate 32 and the first conductor patterns 19 to each other. The first conductor patterns 19 project upward from the first board body upper main surface S1. Accordingly, the pressure applied to the portion of the anisotropic conductive film 80 located between the first conductor patterns 19 and the metal plate 32 is larger than the pressure applied to the portion other than the portion of the anisotropic conductive film 80 located between the first conductor patterns 19 and the metal plate 32. Accordingly, the first conductor patterns 19 and the metal plate 32 are electrically connected to each other via the conductive particles included in the anisotropic conductive film 80. It should be noted that the other structure of the electronic device 10c is the same as that of the electronic device 10, and accordingly, description thereof is omitted.

Fourth Modification

Figure 7:
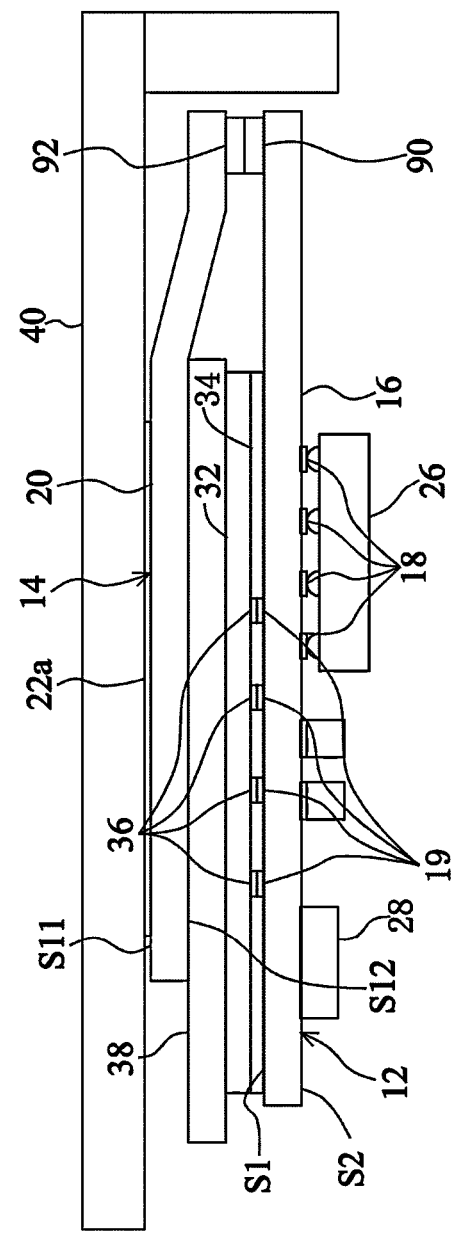
FIG. 7 is a rear view of an electronic device 10d.

An electronic device 10d according to a fourth modification will be described below with reference to the drawings. FIG. 7 is a rear view of the electronic device 10d.

The electronic device 10d differs from the electronic device 10 in that the electronic device 10d includes connectors 90 and 92 instead of the coupling portion 24. The connector 90 is mounted on the first board body upper main surface S1 of the first board body 16. The connector 92 is mounted on the second board body lower main surface S12 of the second board body 20. The connector 90 and the connector 92 are electrically connected to each other. Accordingly, the semiconductor element 26 and the antennas 22a to 22c are electrically connected to each other via the first board 12, the connectors 90 and 92, and the second board 14. The other structure of the electronic device 10d is the same as that of the electronic device 10, and accordingly, description thereof is omitted.

Fifth Modification

An electronic device 10e according to a fifth modification will be described below with reference to the drawings. FIG. 8 is a rear view of the electronic device 10e.

The electronic device 10e differs from the electronic device 10 in that the second board body 20 and the coupling portion 24 are electrically connected to each other via the connectors 90 and 92. That is, the connector 90 is mounted on the outer peripheral surface of the coupling portion 24. The connector 92 is mounted on the second board body lower main surface S12. The connector 90 is electrically connected to the connector 92. The other structure of the electronic device 10e is the same as that of the electronic device 10, and accordingly, description thereof is omitted. The electronic device 10e can achieve the same effect as the electronic device 10.

In addition, since the electronic device 10e can be disposed three-dimensionally, the storage space of the electronic device 10e can be reduced. In addition, since the coupling portion 24 can be connected to the thin plate-shaped second board body 20, the gap between the second board body 20 and the housing 40 can be reduced. In addition, since the coupling portion 24 can be detached from the second board body 20, components can be easily replaced.

Since the thickness of the coupling portion 24 is small in the electronic device 10e, the curvature radius of the coupling portion 24 can be reduced. Accordingly, the coupling portion 24 can be disposed in a small space. In addition, since the thickness of the coupling portion 24 is small, the coupling portion 24 is easily bent. Accordingly, the force exerted by the coupling portion 24 on the connector 90 is small. As a result, an unnecessary force is less likely to be applied to the portion between the connector 90 and the connector 92.

Sixth Modification

An electronic device 10f according to a sixth modification will be described below with reference to the drawings. FIG. 9 is a rear view of the electronic device 10f.

The electronic device 10f differs from the electronic device 10e in that the thickness of the first board body 16, the thickness of the second board body 20, and the thickness of the coupling portion 24 are identical to each other. The other structure of the electronic device 10f is the same as that of the electronic device 10e, and accordingly, description thereof is omitted.

In addition, since the electronic device 10f can be disposed three-dimensionally, the storage space of the electronic device 10f can be reduced. In addition, since the coupling portion 24 can be connected to the thin plate-shaped second board body 20, the gap between the second board body 20 and the housing 40 can be reduced. In addition, since the coupling portion 24 can be detached from the second board body 20, components can be easily replaced.

Seventh Modification

An electronic device 10g according to a seventh modification will be described below with reference to the drawings. FIG. 10 is a rear view of the electronic device 10g.

The electronic device 10g differs from the electronic device 10 in that the thickness of the first board body 16, the thickness of the second board body 20, and the thickness of the coupling portion 24 are identical to each other and the first board body 16 and the second board body 20 are bent in the vertical direction. More specifically, the thickness of the first board body 16, the thickness of the second board body 20, and the thickness of the coupling portion 24 are identical to each other. This causes the first board body 16 and the second board body 20 to easily bend in the vertical direction similarly to the coupling portion 24. In addition, there is no step at the boundary between the first board body 16 and the coupling portion 24. There is no step at the boundary between the second board body 20 and the coupling portion 24. This prevents the resin board 50 from being broken at the boundary between the first board body 16 and the coupling portion 24 and at the boundary between the second board body 20 and the coupling portion 24. In addition, since there is no need to form a cavity in the resin board 50, the structure of the resin board 50 becomes simple. As a result, the resin board 50 can be manufactured easily. However, the metal plate 32 is provided on the first board body upper main surface S1. Accordingly, a first board body 16 portion in which the metal plate 32 is not provided is bent in the vertical direction. It should be noted that the coupling portion 24 may have a structure in which the coupling portion 24 is easily bent in the vertical direction by, for example, reducing the number of conductor layers of the coupling portion 24.

When the thickness of the first board body 16 and the thickness of the second board body 20 are identical to the thickness of the coupling portion 24 as described above, the first board body 16 and the second board body 20 become thinner. As a result, the resin board 50 can be disposed in a narrow space by bending the resin board 50.

Other Preferred Embodiments

The electronic devices according to preferred embodiments of the present invention are not limited to the electronic devices 10 and 10a to 10g and can be modified within the scope of the concept. It should be noted that the structures of the electronic devices 10 and 10a to 10g may be combined arbitrarily.

The antennas 22a to 22c need only be provided in the second board body 20, and may be provided inside the second board body 20 or on the second board body lower main surface S12.

The antennas 22a to 22c need not be formed of the conductor patterns of the second board 14. The antennas 22a to 22c may be components mounted on the second board body 20.

Each of the electronic devices 10 and 10a to 10g includes three antennas, for example. However, each of the electronic devices 10 and 10a to 10g may have one or two antennas or four or more antennas.

The metal plate 32 need not overlap the antennas 22a to 22c in the vertical direction.

The metal plate 32 need not overlap the entire semiconductor element 26 in the vertical direction. That is, the metal plate 32 may overlap a portion of the semiconductor element 26 in the vertical direction. However, the metal plate 32 overlaps the entire semiconductor element 26 in the vertical direction. Accordingly, it is possible to more effectively reduce or prevent the semiconductor element 26 from being affected by the RF signal (electromagnetic wave) from the antennas 22a to 22c or to more effectively reduce or prevent the antennas 22a to 22c from being affected by noise of the semiconductor element 26.

The antennas 22a to 22c emit the transmission signal output by the semiconductor element 26 as the electromagnetic wave and output the received electromagnetic wave to the semiconductor element 26 as the reception signal. However, the antennas 22a to 22c may either emit the transmission signal output by the semiconductor element 26 as the electromagnetic wave or output the received electromagnetic wave to the semiconductor element 26 as the reception signal.

The antennas 22a to 22c need not be electrically connected to the semiconductor element 26. In addition, the semiconductor element 26 need not be an RFIC. That is, the antennas 22a to 22c need not emit the transmission signal output by the semiconductor element 26 as the electromagnetic wave and need not output the received electromagnetic wave to the semiconductor element 26 as the reception signal.

The first board 12 may include conductor patterns inside the first board body 16, on the first board body upper main surface S1, or on the first board body lower main surface S2. The second board 14 may have conductor patterns inside the second board body 20, on the second board body upper main surface S11, or on the second board body lower main surface S12. The coupling portion 24 may include conductor patterns inside the coupling portion 24 or on two main surfaces of the coupling portion 24.

The first board 12 and the second board 14 may be or need not be flexible.

In the electronic device 10, the first conductor patterns 18 and the metal plate 32 may be electrically connected to each other by surface-joining the first board body upper main surface S1 and the metal plate 32 to each other by using conductive joint materials instead of the insulating resin layer 34 and the connection conductor 36.

It should be noted that the housing 40 supports the second board 14 in the electronic device 10a. In addition, the support member 60 supports the first board 12. However, the housing 40 may support the first board 12. In addition, the support member 60 may support the second board 14. That is, the housing 40 need only support one of the first board 12 and the second board 14. The support member 60 need only support the other of the first board 12 and the second board 14.

It should be noted that an anisotropic conductive film, solder, or the like may be used instead of the connectors 90 and 92 in the electronic device 10d. Since the parasitic components caused by the connectors 90 and 92 are eliminated in this case, the reflection of high-frequency signals is reduced or prevented.

It should be noted that the first board body 16 and/or the second board body 20 may be bent in the vertical direction in the electronic devices 10 and 10a to 10g.

It should be noted that the electronic device 10a may further include the spacer 38. That is, the electronic device 10a may have both the spacer 38 and the support member 60. This makes the distance between the antennas 22a to 22c and the metal plate 32 constant. As a result, variations in the capacitance between the antennas 22a to 22c and the metal plate 32 connected to the ground potential are reduced. In addition, the antennas 22a to 22c can be positioned with respect to the housing 40. Accordingly, variations in the distance between the antennas 22a to 22c and the housing 40 are reduced.

It should be noted that the connector 92 may be mounted on the second board body upper main surface S11 in the electronic devices 10e and 10f.

It should be noted that, in the electronic devices 10e and 10f, the second board body 20 and the coupling portion 24 may be connected to each other not by the connectors 90 and 92 but by conductive connection members. In this case, the electronic devices 10e and 10f can be made thinner.

It should be noted that the thickness of the coupling portion 24 is smaller than the thickness of the first board body 16 and the thickness of the second board body 20 in the electronic device 10e. Accordingly, a cavity (dug portion) is formed at a position in the resin board 50 that corresponds to the coupling portion 24. In this case, the resin board 50 is bent such that the first board body lower main surface S2 is continuous with the outer peripheral surface of the coupling portion 24. This reduces or prevents breakage from occurring at the boundary between the coupling portion 24 and the first board body 16. However, the resin board 50 may be bent such that the first board body upper main surface S1 is continuous with the inner peripheral surface of the coupling portion 24.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic device comprising:
   a first board including a first board body and a first conductor pattern;
   a second board including a second board body;
   a semiconductor element;
   an antenna;
   a metal plate; and
   at least one of a coupling portion and a connecting member; wherein
   the first board body includes a first board body upper main surface and a first board body lower main surface that are arranged in a vertical direction;
   the second board body includes a second board body upper main surface and a second board body lower main surface that are arranged in the vertical direction;
   the second board body is above the first board body such that the first board body upper main surface and the second board body lower main surface face each other;
   the semiconductor element is mounted on the first board body lower main surface;
   the antenna is provided on the second board body;
   a thickness of the metal plate is larger than a thickness of the first conductor pattern, and the metal plate is surface-joined to the first board body upper main surface to overlap the semiconductor element in the vertical direction; and
   the first board body and the second board body are included in at least one resin board, and at least one of the first board body, the second board body, and the coupling portion is bent in the vertical direction so as to couple the first board body and the second board body to each other.

2. The electronic device according to claim 1, wherein the metal plate overlaps the antenna in the vertical direction.

3. The electronic device according to claim 1, wherein the first conductor pattern is provided on the first board body upper main surface, and the metal plate is electrically connected to the first conductor pattern.

4. The electronic device according to claim 3, further comprising:
   a connection conductor provided on the first conductor pattern; and
   an insulating resin layer through which the metal plate is surface-joined to the first board body upper main surface; wherein
   the metal plate is electrically connected to the first conductor pattern via the connection conductor.

5. The electronic device according to claim 3, further comprising:
   an anisotropic conductive film through which the metal plate is surface-joined to the first substrate body upper main surface and the metal plate is electrically connected to the first conductor pattern.

6. The electronic device according to claim 1, further comprising:
   a housing that supports one of the first board and the second board; and
   a support that supports the other of the first board and the second board and is supported by the housing.

7. The electronic device according to claim 1, further comprising:
   a spacer provided between the second board body lower main surface and the metal plate.

8. The electronic device according to claim 1, further comprising:
   a metal component electrically connected to the metal plate.

9. The electronic device according to claim 1, wherein the antenna is electrically connected to the semiconductor element.

10. The electronic device according to claim 1, wherein the semiconductor element is an RFIC.

11. The electronic device according to claim 10, wherein the antenna is operable to emit a transmission signal output by the semiconductor element as an electromagnetic wave or the antenna is operable to output a received electromagnetic wave to the semiconductor element as a reception signal.

12. The electronic device according to claim 1, wherein the metal plate is connected to a ground potential.

13. The electronic device according to claim 1, wherein the electronic device is a mobile communication terminal.

14. The electronic device according to claim 1, wherein a thickness of the coupling portion is less than a thickness of the first board and the second board.

15. The electronic device according to claim 1, wherein a plurality of electronic components in addition to the semiconductor element are mounted on the first board body lower main surface.

16. The electronic device according to claim 1, wherein a plurality of antennas as provided in addition to the antenna.

17. The electronic device according to claim 16, wherein the plurality of antennas are electrically connected to the semiconductor element.

18. The electronic device according to claim 16, wherein the plurality of antennas are patch antennas.

19. The electronic device according to claim 16, wherein the plurality of antennas are square or substantially square.

* * * * *